(12) United States Patent
Watanabe et al.

(10) Patent No.: US 6,671,210 B2
(45) Date of Patent: Dec. 30, 2003

(54) THREE-TRANSISTOR PIPELINED DYNAMIC RANDOM ACCESS MEMORY

(75) Inventors: Takao Watanabe, Fuchu (JP); Hiroyuki Mizuno, Kokubunji (JP); Satoru Akiyama, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/266,748

(22) Filed: Oct. 9, 2002

(65) Prior Publication Data
US 2003/0026156 A1 Feb. 6, 2003

Related U.S. Application Data

(63) Continuation of application No. 09/931,895, filed on Aug. 20, 2001, now Pat. No. 6,487,135.

(30) Foreign Application Priority Data

Oct. 31, 2000 (JP) ........................................ 2000-337240

(51) Int. Cl.$^7$ ........................... G11C 8/14; G11C 11/405
(52) U.S. Cl. ...................... 365/187; 365/230.06; 365/63
(58) Field of Search ................................ 365/222, 187, 365/230.04, 230.06, 63

(56) References Cited

U.S. PATENT DOCUMENTS

| | | | | |
|---|---|---|---|---|
| 4,935,896 A | * | 6/1990 | Matsumura et al. ........ | 365/187 |
| 5,655,105 A | | 8/1997 | McLaury ................... | 365/194 |
| 5,778,237 A | | 7/1998 | Yamamoto et al. ......... | 713/322 |
| 6,307,788 B1 | * | 10/2001 | Tanaka ....................... | 365/187 |
| 6,385,709 B2 | | 5/2002 | Merritt ....................... | 365/233 |
| 6,430,098 B1 | * | 8/2002 | Afghahi et al. ............. | 365/203 |

FOREIGN PATENT DOCUMENTS

JP 10-134565 5/1998

OTHER PUBLICATIONS

M.W. Regitz et al., "WPM 4.2: A Three–Transistor–Cell, 1024–Bit, 500 NS MOS RAM", *IEEE International Solid–State Circuits Conference*, Feb. 18, 1970, pp. 42–43.

Itoh, Kiyoo, "Super LSI Memory", published by Baihukan, Nov. 5, 1994, pp. 2–5.

* cited by examiner

*Primary Examiner*—Van Thu Nguyen
*Assistant Examiner*—Jung H. Hur
(74) *Attorney, Agent, or Firm*—Miles & Stockbridge P.C.

(57) ABSTRACT

A semiconductor device includes a plurality of DRAM memory cells each having first, second, and third MOS transistors; a plurality of first word lines coupled to the gates of the first MOS transistors; a plurality of second word lines coupled to the gates of the second MOS transistors; a plurality of first bit lines coupled to the source/drain paths of the first MOS transistors; and a plurality of second bit lines coupled to the source/drain paths of the second MOS transistors. The plurality of DRAM memory cells includes a series of such memory cells defining a plurality of groups of k memory cells, and the plurality of first word lines includes a group of k first word lines, each of which is coupled to a gate of a first MOS transistor only in every $k^{th}$ DRAM memory cell of the series, wherein k is greater than one.

10 Claims, 7 Drawing Sheets

THREE-TRANSISTOR PIPELINED DYNAMIC RANDOM ACCESS MEMORY

CROSS REFERENCE TO RELATED APPLICATIONS

This application is a continuation of application Ser. No. 09/931,895 filed Aug. 20, 2001, now U.S. Pat. No. 6,487,135.

BACKGROUND OF THE INVENTION

The present invention relates to a semiconductor device, and in particular, to a low-cost, high-speed, low-power, highly integrated semiconductor storage device (memory) and a semiconductor device integrally including a logic circuit and a semiconductor storage device.

In the recent situation of the multimedia age, such needs of high-speed data processing, lower power consumption, downsizing of devices are increasingly growing also for devices and apparatuses which are daily used by individual persons. As a technique to satisfy the needs, a large-scale integration unit including a large capacity memory and a logic circuit has attracted attention. When a memory and a logic circuit is integrally formed in one chip, the memory and the logic circuit can be connected to each other using many fine wiring zones on the chip. Therefore, a large amount of data can be transferred at a time and hence a high-speed data transfer is possible. When compared with a case in which different chips are connected to each other, the power consumed to transfer data can be reduced since the wiring capacity is small and the data transfer distance is short. Naturally, the number of chips to configure a system can also be decreased, and hence the system size can be minimized.

SUMMARY OF THE INVENTION

As a memory to be integrally included in one chip together with a logic circuit, a 6-transistor static memory cell (to be abbreviated as a 6T-static random access memory (SRAM) or a 6T-SRAM cell) including six transistors is used in general. However, there has been recently developed an example using a dynamic memory cell (to be referred to as a 1T-dynamic random access memory (DRAM) cell or a 1T-SRAM memory cell) including one transistor and one capacitor. The 1T-DRAM cell is smaller in area than the 6T-SRAM cell. Therefore, when 1T-DRAM cells are used, a larger number of memories can be integrated in a unitary area of the chip. However, there exists drawbacks as follows. First, since the capacitor included in the memory cell has a three-dimensional configuration. This increases the number of processes and soars the production cost. Additionally, since data accumulated as electric charge in the capacitor decreases by a leakage current, a so-called refresh operation is required. Moreover, when compared with a case in which 6T-SRAM cells are employed, the access speed is increased, particularly, the access speed associated with an operation to change a row address. The primary reason is that the contents of storage are destructed in a read/write operation in an 1T-DRAM cell and hence the so-called re-write operation is required. The configuration and operation of a memory including 1T-DRAM cells have been well known, and hence details thereof will not be described. Reference is to be made to, for example, "Super LSI Memory" written by Kiyoo Itoh and published from Baihukan.

For a memory cell which cope with the drawbacks of the 1T-DRAM, JP-A-10-134565 describes a semiconductor storage device using a 3-transistor dynamic memory cell (to be referred to as 3T memory cell or 3T-DRAM cell herebelow). The 3T-DRAM cell occupies a less area than the 1T-DRAM occupying a less area than the 6T-SRAM. Since the 3T-DRAM cell primarily includes only transistors, it is not required to conduct the process to form a capacitor having a three-dimensional structure. Therefore, the memory including 3T-DRAM cells can be fabricated in the same transistor processes as for the memory including 6T-SRAM cells. Furthermore, according to JP-A-10-134565, when a word line is subdivided into (sub-) word lines and a logical gate is disposed for each word line, the reading and writing operations can be achieved in a non-destructive manner and the cycle time can be reduced. Consequently, when compared with the case in which 1T-DRAM cells are used, a higher-speed memory is possibly implemented.

However, even if the non-destructive operation alone is made possible, it is difficult to achieve a cycle speed similar to that of the 6T-SRAM. In the 3T-DRAM cell, charge is accumulated in the gate capacity of a transistor, the refresh operation is required. Also in this point, the 3T-DRAM cell is less easily handled as compared with the 6T-SRAM. In the 3T-DRAM cell, a fine transistor is required to keep a small memory cell area. Resultantly, it is impossible to provide a large accumulation capacity similar to that of the 1T-DRAM using a three-dimensional capacitor. Therefore, there exists a fear the refresh operation is considerably more frequently executed as compared with the 1T-DRAM cell. This increases the probability of occurrence of conflict between an access to the 3T-DRAM cell for other than the refresh operation (external access) and an internal access for the refresh operation. Additionally, when a memory and a logic circuit are mounted on one chip, a plurality of circuits access the memory in many cases. In a representative example such as graphics processing, a frame memory to store screen information must receive two kinds of accesses including read and write operations from a circuit which generates pixel information to draw an image and a read operation from a circuit which displays memory contents on a screen. To cope with a plurality of accesses as above, to completely use a memory having relatively insufficient refresh characteristic, operation becomes quite complicated.

As already described, memories employing 1T-DRAM, 3T-DRAM, and 6T-SRAM cells have been known. The 1T-DRAM cell is slow in operation, requires a high process cost, and must be refreshed. The 3T-DRAM cell is less satisfactory in the refresh characteristic, and the 6T-SRAM cell is a drawback of large area. When using 1T-DRAM and 3T-DRAM cells requiring the refresh operation, it is difficult in operation to minimize conflicts between the refresh operation and many accesses.

In this situation, a first object of the present invention is to provide a memory capable of operating at a high speed. A second object of the present invention is to provide a memory which can be produced at a low process cost. A third object of the present invention is to provide a memory for which an external refresh operation is not required. A fifth object of the present invention is to provide a memory occupying an area which is less than an area occupied by a memory including 6T-SRAM cells. A sixth object of the present invention is to provide a memory with favorable usability for a plurality of accesses thereto.

These problems will be solved according to the present invention as follows.

To implement a high-speed memory, the read and write operations are conducted in a non-destructive operation and are pipelined. Only by conducting the read and write operations are executed in a non-destructive operation as in the prior art example, the cycle time of the memory is possibly reduced to some extent. However, by pipelining the read operation and the write operation, an external access can be received in a cycle time shorter than the inherent cycle time. In a specific configuration for the pipeline operation, a latch circuit for addresses and commands and latch circuit for data are disposed to pipeline internal operation of the memory. To implement a memory at a low process cost, a memory cell like the 3T-DRAM including only transistors is employed or a 1T-DRAM cell using a capacitor in a simple configuration such as a planar type capacitor is employed. To implement a memory for which the external refresh operation is not required, the memory is operating at a frequency higher than a frequency of an external clock signal so that the refresh operation is executed when any external access is absent. To implement a memory occupying an area which is less than an area occupied by a memory including 6T-SRAM cells, memory cells each of which includes a small number of elements such as 1T-DRAM cells or 3T-DRAM cells are employed. To implement with favorable usability for a plurality of accesses thereto, the operating frequency of the memory is set to a value more than a value obtained by adding the total frequency of external accesses to the frequency of internal access operation for the refresh operation. This makes it possible that all external accesses and the accesses necessary for the refresh operation can be executed without any conflict. That is, when viewed from all circuits to access the memory, the refresh operation can be hidden. Therefore, it is possible to implement a memory with sufficient usability.

BRIEF DESCRIPTION OF THE DRAWINGS

The present invention will be more apparent from the following detailed description, when taken in conjunction with the accompanying drawings, in which.

DESCRIPTION OF THE EMBODIMENTS

Figure 1:
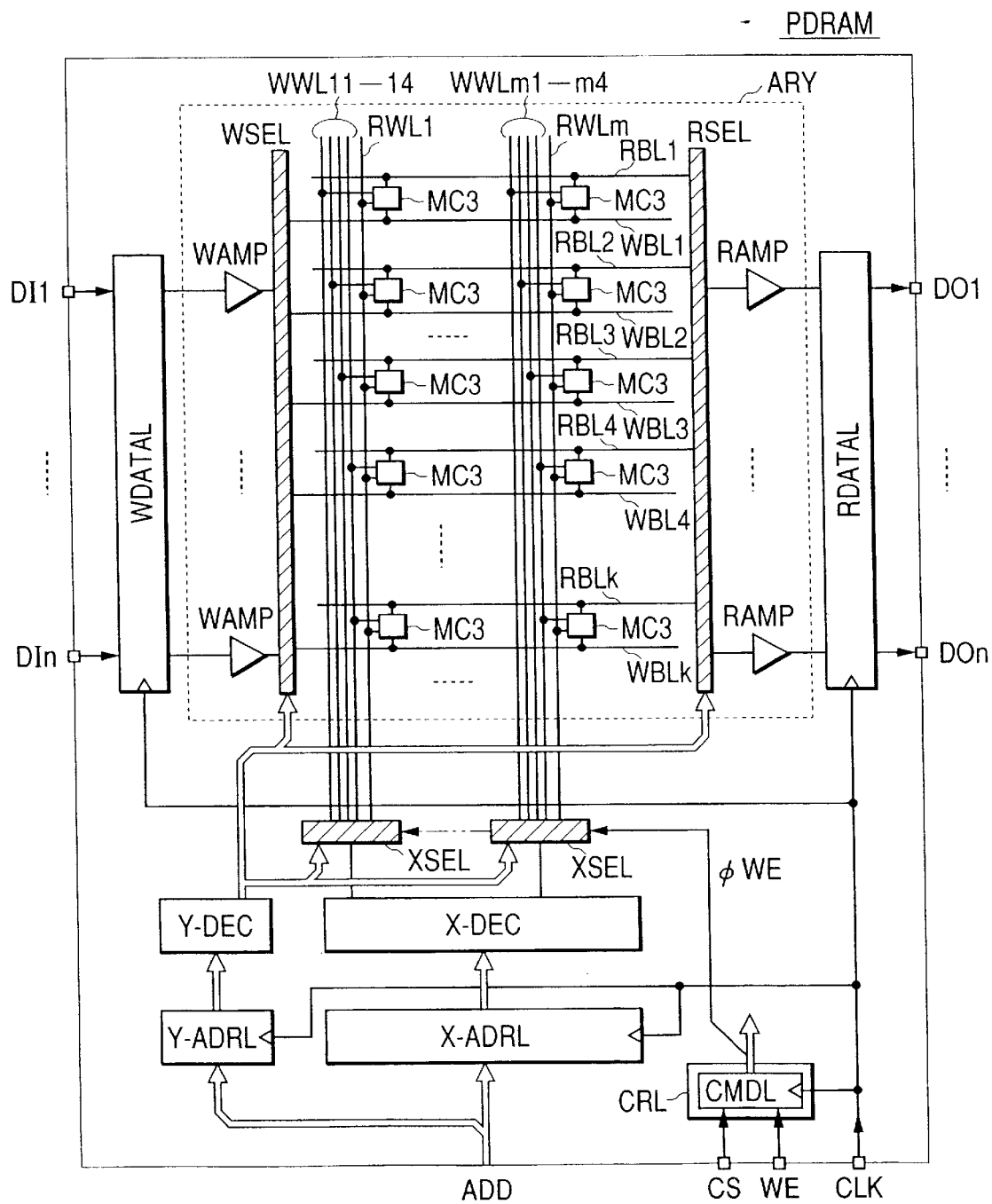
FIG. 1 is a diagram showing constitution of an embodiment of a pipelined dynamic memory (PDRAM) including 3T-DRAM cells for non-destructive operation.

Description will now be given of an embodiment of the present invention by referring to the drawings. Although the description will be given of an embodiment to achieve five objects above at the same time, it is also possible to use a unit or a section which achieves part of the objects when necessary. For example, in the following description, 3T-DRAM cells are operated in a non-destructive mode to execute the pipeline operation. There possibly exists a case in which, for example, the process cost reduction and increase in the operation speed are not strongly required, but a large memory capacity is necessary. In this situation, 1T-DRAM cells each of which includes a three-dimensional capacitor are operated in the ordinary destructive mode, and only the unit to hide the refresh operation may be employed. There may also exist a case in which the low process cost and the high integration are required and the refresh operation is to be hidden from a plurality of circuits. In this situation, planar 1T-DRAM cells may also be used. Depending on required performance, it is possible to select part of or all of the components or units to implement various configurations.

Circuit elements constituting each block of the embodiments are formed, not limited to, on one semiconductor substrate such as a single crystal substrate by known integrated circuit techniques such as a complementary MOS transistor technique. For the circuit symbols of metal oxide semiconductor field effect transistors (MOSFET), those not indicated with a circle at a gate thereof are an n-type MOSFET (NMOS) and those indicated with a circle at a gate thereof are a p-type MOSFET (PMOS). For simplicity, an MOSFET is called "MOS" or "MOS transistor" herebelow. However, in this specification, an MOSFET is not limited to an FET including a metal oxide insulation film disposed between a metallic gate and a semiconductor layer, but includes also a general FET such as a metal insulator semiconductor FET (MISFET).

Strictly speaking, a latch circuit, a flip-flop circuit, and a register circuit inherently differ from each other. However, these circuits are collectively referred to as "latch circuits" if not otherwise specified.

Figure 2:
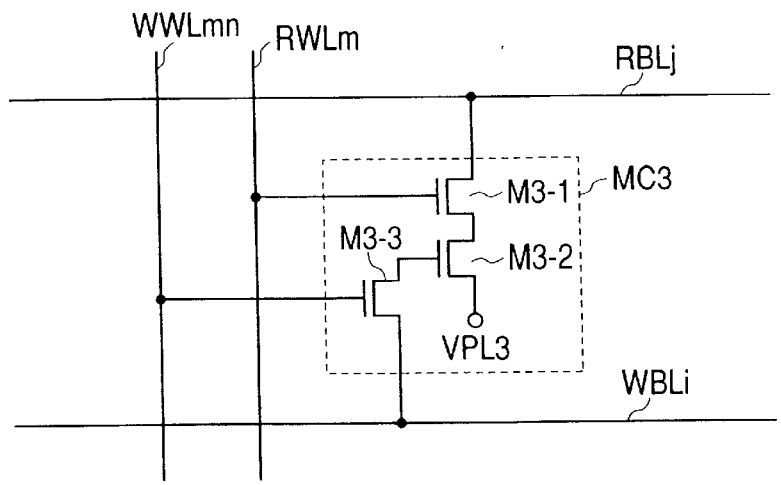
FIG. 2 is a diagram showing constitution of an embodiment indicating an example of 3T-DRAM cells employed by the present invention.
Figure 3:
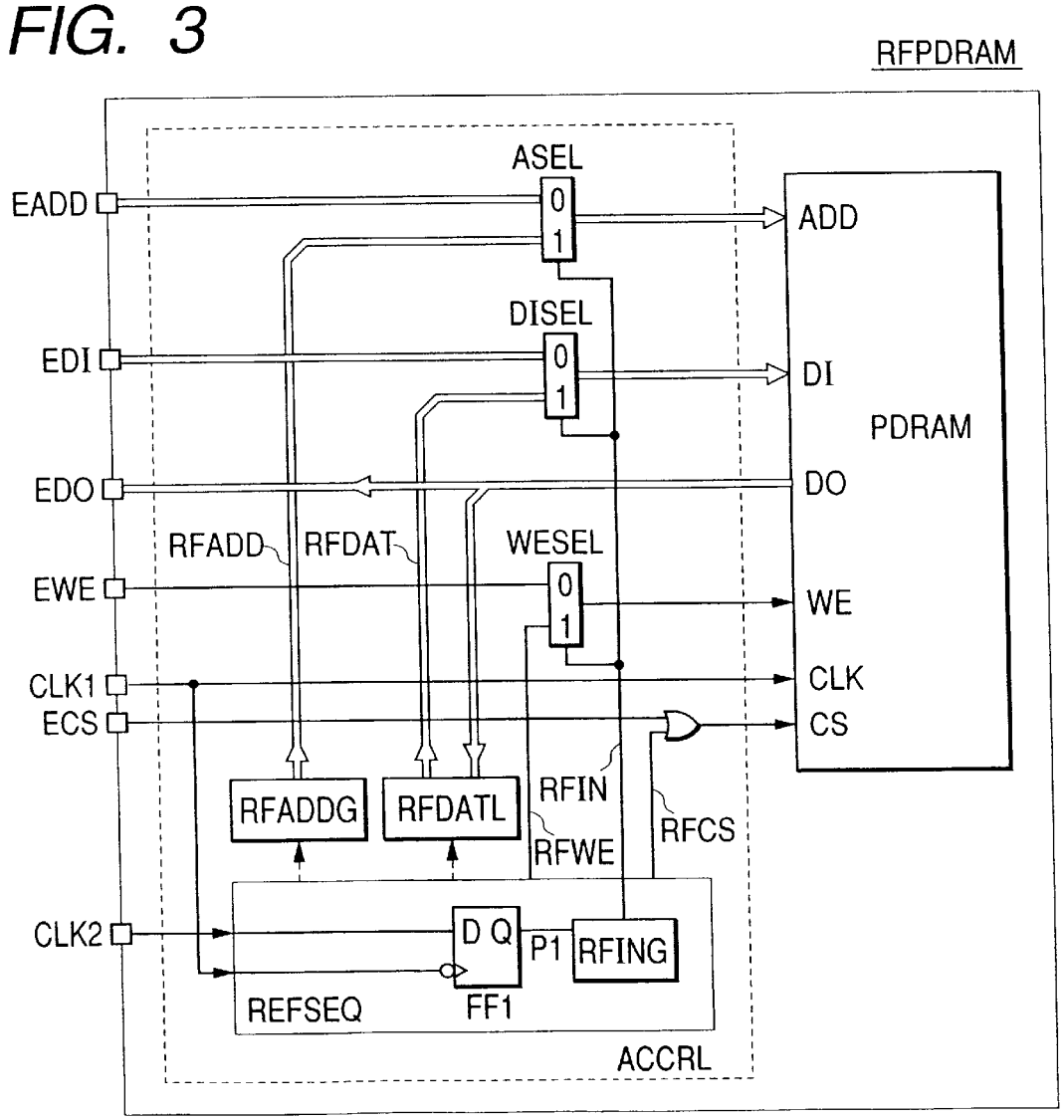
FIG. 3 is a diagram showing an embodiment of constitution of a refresh-free pipelined dynamic memory (RFPDRAM) including a control circuit to externally hide the refresh operation from the PDRAM of FIG. 1.
Figure 4:
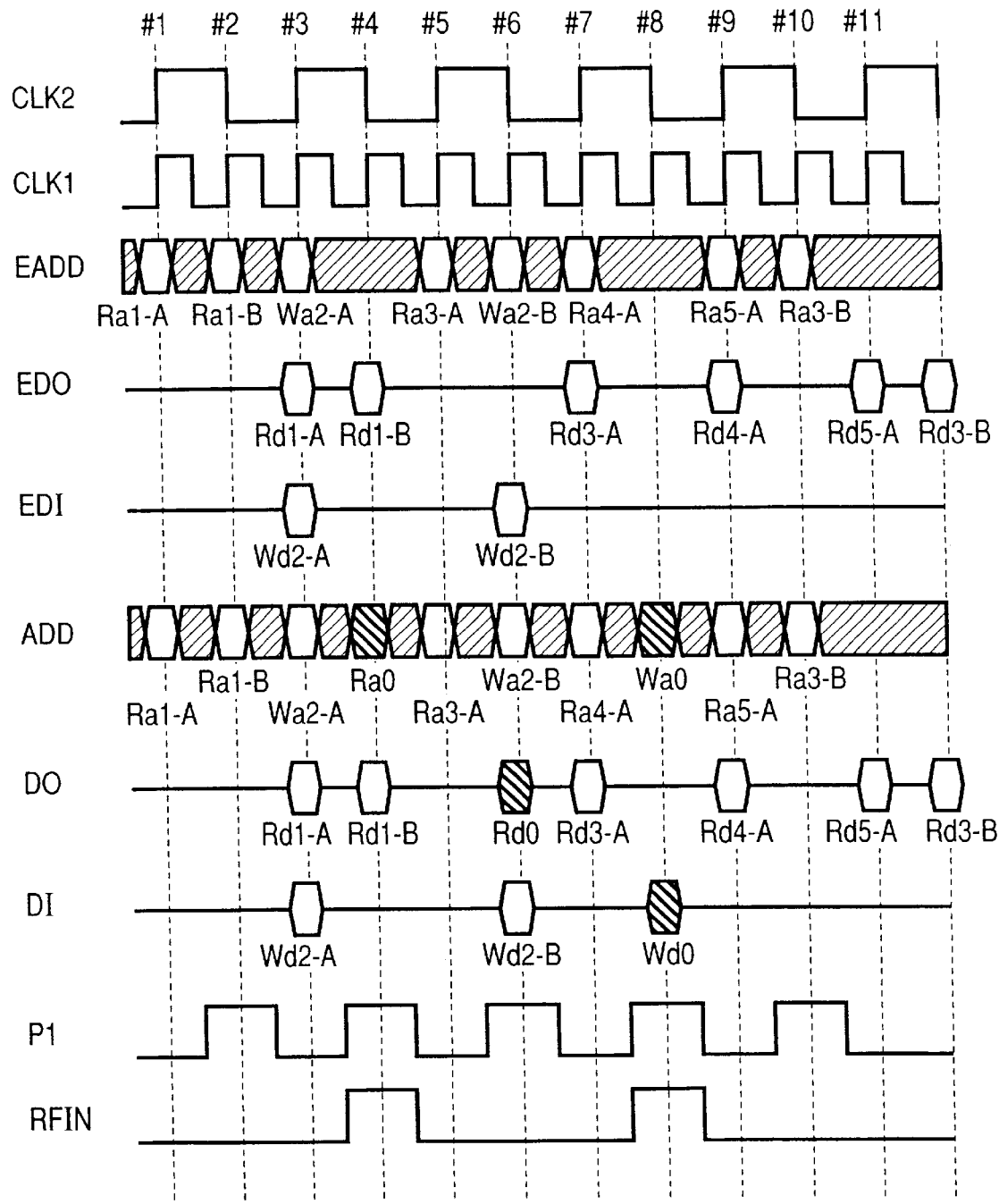
FIG. 4 is a diagram showing an example of operation timing of the embodiment of FIG. 3.

Referring to FIGS. 1 to 4, description will be given of a representative embodiment of the present invention. FIG. 1 shows an embodiment of a non-destructive pipelined dynamic memory (PDRAM) configured with 3T-DRAM cells. FIG. 2 shows an embodiment of a memory cell used in FIG. 1. FIG. 3 shows an embodiment of a control circuit to hide the refresh operation in the memory of FIG. 1. FIG. 4 is a timing chart of operation to hide refresh operation for memory accesses from two circuits. First, operation of FIGS. 1 and 2 will be described. In FIG. 1, an MC3 is a 3T memory cell. As shown in FIG. 2, the MC3 includes NMOS transistors M3-1, M3-2, and M3-3, a read word line RWLm, a write word line WWLmn, a read bit line RBLj, a write bit line WBLi, and a power source terminal VPL3. Information is stored as charge in a gate terminal of the M3-2. In a read operation, a high voltage is applied to the read word line RWLm. This turns the NMOS transistor M3-1 on, and a current flows through the read bit line RBLj according to the gate potential of the NMOS transistor M3-2. In the write operation, a high voltage is applied to the write word line WWLmn to turn the NMOS transistor M3-3 on such that a voltage is directly applied from the write bit line WBLi to the gate (potential) of the NMOS transistor M3-2. In the read operation, since the gate and the bit line are not electrically conductive to each other in the MOS transistor M3-2 to accumulate information, stored information cannot be destroyed. Therefore, any re-write operation is not required and a high-speed cycle time can be implemented. On the other hand, in the write operation, the gate of the MOS transistor M3-2 is electrically conductive to the write bit line WBLi via the MOS transistor M3-3. Therefore, when memory cells of this type are configured in an array and a word line is shared between memory cells, there possibly exists the following fear. When an attempt is made to selectively write data in part of memory cells simultaneously selected, information in memory cells not selected is destroyed. This consequently requires a re-write operation in the write operation. JP-A-10-134565 describes the event in detail. In the example described in the publication, a word line is subdivided into (sub-) word lines and a logic gate is disposed for each word line so that the read and write operations are executed in the non-destructive mode. Also in the present invention, to reduce the pipeline cycle time, it is necessary to execute the read and write operations in the non-destructive mode. To implement the non-destructive read and write operations, there may naturally be used a method similar to that of the known example. However, the embodiment of FIG. 1 employs another method suitable for high integration. In FIG. 1, a memory array includes k sets of write and read bit lines and m sets of write and read word lines. However, a write word line is connected to every fourth memory cells. Although details of operation will be described later, in the write operation, one of the word lines is selected and information is simultaneously written from input terminals DI1 to DIn to memory cells connected to the selected word line. Therefore, the write operation can be executed in the non-destructive mode. Since the read operation is inherently non-destructive, the word lines are not subdivided. In general, the 3T-DRAM can be dimensioned to dispose a plurality of wiring zones thereon, and hence the increase in area as a result of the provision of the word lines rarely arises a problem. It is rather advantageous because x selector circuits XSEL can be collectively arranged to minimize the occupied area. Next, operation of FIG. 1 will be described. In FIG. 1, symbols indicated outside the frame are signal names and small rectangles indicate signal terminals; moreover, CLK is a clock signal, ADD is an address signal, CS is a chip select signal, and WE is a write enable signal. DI1 to DIn are input data and DO1 to DOn are output data. Meaning of CS and WE are the same as for an ordinary memory. A correspondence between the magnitude of signal potential and validity/non-validity of signals can be determined in various ways. Assume in this case that when CS is set to high potential, the memory PDRAM accepts an access; when WE is set to high potential with CS at high potential, the memory PDRAM accepts a write operation; and when WE is set to low potential with CS at high potential, the memory PDRAM accepts a read operation. In FIG. 1, CRL is a control circuit which receives control signals such as CS and WE to control operation of internal circuits such as an address decoder and a latch circuit. For simplicity of drawings, only part of control signals distributed from the controller to the internal circuits are shown. Moreover, X-ADRL, Y-ADRL, RDATAL, WDATAL, and CMDL indicate latch circuits to latch an x address, a y address, read data, write data, and a control signal, respectively. Using these components, the memory can achieve a pipeline operation.

In the read operation, an x address and a y address are once stored respectively in the address latches X-ADRL and Y-ADRL and a command corresponding to a read or readout operation is once stored in the command latch such that the addresses are inputted to an x decoder, X-DEC and a y decoder, Y-DEC. According to an output from the x decoder, one of the read word lines RWL1 to RWLn is selected, a signal is read to be fed to the read bit lines RBL1 to RBLk; the signal is then selected by a read data selector RSEL according to an output from the y decoder to be fed to a read amplifier RAMP. An output from the read amplifier RAMP is inputted to a read data latch RDATA in response to a subsequent clock signal to be outputted as data output signals DO1 to DOn.

Also in the write operation, an x address and a y address are once stored respectively in the address latches X-ADRL and Y-ADRL and a command corresponding to a read or readout operation is once stored in the command latch such that the addresses are inputted to an x decoder and a y decoder. Operation up to this point is substantially equal to that of the read operation. Since word lines are classified into 4-line groups, the operation to select a word line is different from that of the read operation. First, according to an output from the x decoder, one of the x selector circuits XSEL is selected. Next, according to an output from the y decoder supplying an input to the XSEL, one of four word lines to be connected to the XSEL is selected. Resultantly, a memory cell thus selected is activated. On the other hand, input data DI1 to DIn is stored in a write data latch RDATAL to be fed to a write data selector WSEL. According to a decode signal inputted from a y decoder Y-DEC, the write data selector WSEL selects a write bit line for the memory cell. Naturally, the selected write bit line is a bit line connected to the memory cell selected by the write word line. As a result, the inputted n data signals DI1 to DIn are each amplified by a write amplifier WAMP and are then fed via the write bit line to be written as storage information in the n selected memory cells. In this way, the write operation is executed for all selected memory cells, and hence the operation is executed in the non-destructive mode. Therefore, the re-write operation is not required and a high-speed operation can be executed.

In this embodiment, since a pipeline operation is executed, the cycle time externally viewed is a pipeline pitch. This further increases the operation speed when compared with the prior art example in which only the non-destructive operation is executed. As well known, in an ordinary design of memories, a signal is read out from a memory cell such as 3T-DRAM cell of FIG. 2, the signal having polarity reversed with respect to polarity of accumulated charge. In this case, it is only necessary in the PDRAM of FIG. 1 to dispose an inverting function in the write amplifier or the read amplifier to match data polarity. In the embodiment, the write word lines are classified into groups each of which includes four word lines. However, the present invention is not restricted by the embodiment. According to the memory array configuration and the necessary numbers of input and output lines, various modifications are possible, for example, each group may include two or eight word lines. This also applies to embodiments described later.

Referring next to FIGS. 3 and 4, description will be given of a method of hiding the refresh operation for memory accesses from two circuits. FIG. 3 shows an embodiment of a refresh-free pipelined dynamic memory (RFPDRAM) in which the refresh operation is hidden. In FIG. 3, PDRAM is a pipelined dynamic memory shown in FIG. 1 and the other circuits are peripheral circuits to hide the refresh operation. In FIG. 3, EADD and EDI respectively indicate an address and data externally inputted thereto; and EDO is data outputted to an external device. Although these items are each configured with a plurality of bits, each item is collectively indicated with one bold line for simplicity of the drawing. EWE and ECS respectively indicate a write enable signal and a chip select signal supplied from an external device. CLK1 and CLK2 are clock signals. The CLK1 has a higher frequency than the CLK2. In the description, two signals CLK1 and CLK2 are inputted from an external device. However, when it is necessary to simplify external control, it is naturally also possible that either one of the clock signals is received from an external device and the other one thereof is internally generated. In FIG. 3, a control signal for the refresh operation is produced from a refresh sequencer REFSEQ. In a 3T-DRAM cell, since there exist two bit lines, namely, a read bit line and a write bit line. Therefore, the refresh operation is executed in the following method. Data is read from the pertinent memory cell to be once held in a latch circuit and the data is written in the memory cell. During the refresh operation, a refresh chip select signal RFCS produced from the refresh sequencer REFSEQ is set to high potential. The refresh chip select signal is inputted via an OR logic circuit to the pipelined dynamic memory PDRAM, and consequently, even if the PDRAM is in a wait or standby state not to receive an access, the PDRAM is set to a state to receive an access. When a refresh input signal RFIN is set to high potential at timing synchronized with an access associated with the refresh operation, the selectors such as an address selector, a data selector, and a write enable selector shown in the drawings execute a switching operation. Resultantly, the signals such as the address signal, the data signal, and the write enable signal are inputted to the PDRAM from the refresh sequencer REFSEQ, not from an external device. As already described, the first step of the refresh operation is a read operation, and hence the refresh write enable signal RFWE is set to low potential. Simultaneously, the refresh address generator RFADDG produces an address of a memory to be refreshed, and the address is fed to the PDRAM. When data is read from the memory cell of the PDRAM, the data is sent from an output terminal DO to be stored in the refresh data latch. On the other hand, in the write operation associated with the refresh operation, the refresh write enable signal RFWE is set to high potential. Data accumulated in the refresh data latch is then fed via a data input terminal DI to be again written in the pertinent memory cell of the PDRAM. As can be seen from the configuration of FIG. 1, the number of memory cells refreshed at a time is equal to that of the memory cells on the write word line.

In the embodiment, by preventing the conflict between the refresh operation and the accesses from external circuits, the refresh operation can be completely hidden from any external device. Referring to FIG. 4, description will be given of a signal timing chart of operation in association with accesses from two external circuits A and B. In the chart, a section marked with corrugated inclined lines rising in a lower-left direction indicates a region in which the signal is invalid, and a section marked with bold inclined line rising in a lower-right direction indicates a signal associated with the refresh operation. Although the signals of FIG. 4 correspond to those in the drawings described above, description will be again given of the signals. CLK1 and CLK2 are clock signals. Although the CLK1 has a frequency which is twice that of the CLK2 in the description, it is only necessary that the CLK1 is larger in the frequency than the CLK2. When the frequencies respectively of CLK1 and CLK2 are f1 and f2, the timing charge can be easily constructed if $f2=f1/n$ ($n=2, 3, \ldots$), more favorably, $f2=f1/2^m$ ($m=1, 2, \ldots$).

EADD indicates an address signal from an external device. In the symbols such as Ra-A and Wa2-B described in the field of EADD, the leading Ra and Wa respectively indicate a read address and a write address, the next numeral indicates a sequential number of access, and the last A and B are used to discriminate the external circuit executing an access operation. For example, Wa2-B is a write address corresponding to a second access from the external circuit B. EDO is output data to be fed to an external circuit. Meaning of the symbols in this field is similar to that described above. However, two leading alphabetical letters, Rd indicate read data. EDI is data inputted from an external circuit. Two leading alphabetical letters, Wd in this field indicate write data. ADD in the next row is an address to be input to the PDRAM, and symbols respectively with -A and -B indicate addresses respectively from the external circuits A and B. Symbols respectively with Ra0 and Wa0 indicate items from the refresh address generator. In two next rows, DO and DI indicate output data from the PDRAM and input data to the PDRAM. Also, symbols respectively with -A and -B indicate data items respectively from the external circuits A and B, and symbols respectively with Ra0 and Wa0 indicate data items from the refresh address generator. In two last rows, signals P1 and RFIN respectively indicate an internal signal and a refresh input signal from the refresh sequencer shown in FIG. 3. Each vertical dotted line indicates timing of a rise edge of clock 1, and a numeral with # at an upper end of the dotted line indicates a cycle number. In this timing chart, the PDRAM executes a pipeline operation at timing synchronized with a high-speed clock signal CLK1, and latency from an address to data is assumed as 2 in the read operation and 0 in the write operation. As can be seen from the external address input EADD in the third row, the access from the external circuit A is executed in an odd cycle such as cycle #1 or cycle #3. The external circuit B executes the access at timing of every fourth even cycle such as cycle #2, cycle #6, and cycle #10. That is, one half of timing of the rising edge of clock 1 is distributed to the access of the external circuit A, and one quarter thereof to the access of the external circuit B. As can be seen from ADD (an address signal fed to the PDRAM), at timing in even cycles such as cycle #4 or cycle #8, an access for a refresh operation is received. In this embodiment as described above, one half of the timing in which the PDRAM can receive an access is distributed to the external circuit A, one quarter thereof to the external circuit B, and the remaining one quarter thereof to the refresh operation. As a result, the PDRAM is a complete pipelined memory in which the refresh operation is hidden from the circuits A and B, and the access to the PDRAM can be executed according to a fixed clock period. For example, when the frequency of CLK1 is 100 megaherz (MHz), it is possible that the access from the circuit A is received at an interval of 50 MHz and the access from the circuit B is received at an interval of 25 MHz. In this connection, since the refresh operation requires two 25 MHz cycles (for the read and write operation), it is possible to execute the refresh operation at an interval of 12.5 MHz if the refresh operation is executed at every possible timing. Naturally, the refresh operation need only be executed when necessary. It is only necessary to execute the refresh operation when necessary at any timing available for the refresh operation. According to the refresh characteristic of the 3T-DRAM cell and conditions (such as temperature) of use of a semiconductor device mounted, various modifications are possible. For example, the ratio of distribution of timing for the refresh operation is changed, the ratio thereof for each circuit is changed, the timing is distributed among three or more external circuits.

In this situation, when the frequency of CLK1 is f1, the frequency of CLK2 is f2, the frequency of CLK3 is f3, and the frequency of the refresh operation is f4, it is only necessary that each ratio of distribution satisfies $f1 \geq f2+f3+f4$. Each of f2, f3, and f4 need not be expressed using a power of two ($f=1/2^m$). However, when f2, f3, and f4 are expressed in this form, synchronization can be easily established between the clock signals, and a more stable operation can be easily executed.

In the sixth cycle, cycle #6 of FIG. 4, a data output operation associated with a read operation for a refresh operation and a write access from the external circuit B are simultaneously executed. However, as can be seen from the configuration of FIG. 1, since the read path and the write path are separated from each other, data collision cannot take place. Even if the access from the external circuit B is a read operation, the data output operation is executed at timing delayed by two cycles, and hence this does not cause any problem. However, in a data output cycle associated with a read operation for a refresh operation, it is necessary that the refresh input signal RFIN is set to low potential such that the selectors of FIG. 3 are switched to supply the address, the write enable signal, and the like from the external circuit to the PDRAM. For this purpose, as shown in the lowest row of FIG. 4, the RFIN signal is at high potential only in cycle #4 and cycle #8. According to the embodiment described above, by using 3T DRAM cells more highly integrated than the SRAM cells, it is possible to construct a pipeline memory access in which the refresh operation is completely hidden from each of external circuits. According to the embodiments shown in FIGS. 1 to 4, five objects of the present invention can be achieved. As above, only part of the components or units may be selectively used. However, there also exists an advantageous effect which can be obtained only by a combination. For example, since the non-destructive operation and the pipeline operation are implemented in FIG. 1, quite a high-speed memory operation can be executed. Therefore, it is easy that all memory cells are refreshed within the retention time of the memory cells.

Figure 5A:
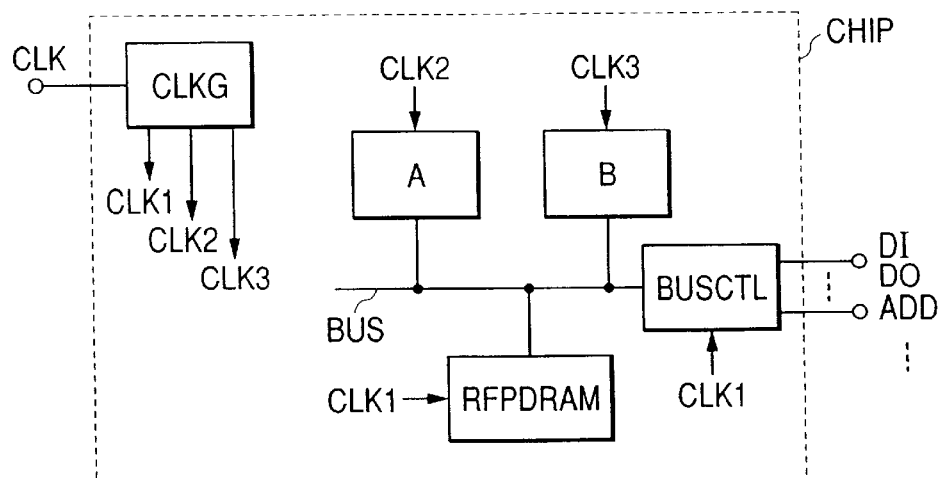
FIGS. 5A and 5B are diagrams showing a configuration of an embodiment in which a memory, RFPDRAM according to the present invention is integrally mounted on a semiconductor chip together with a plurality of circuits.
Figure 5B:
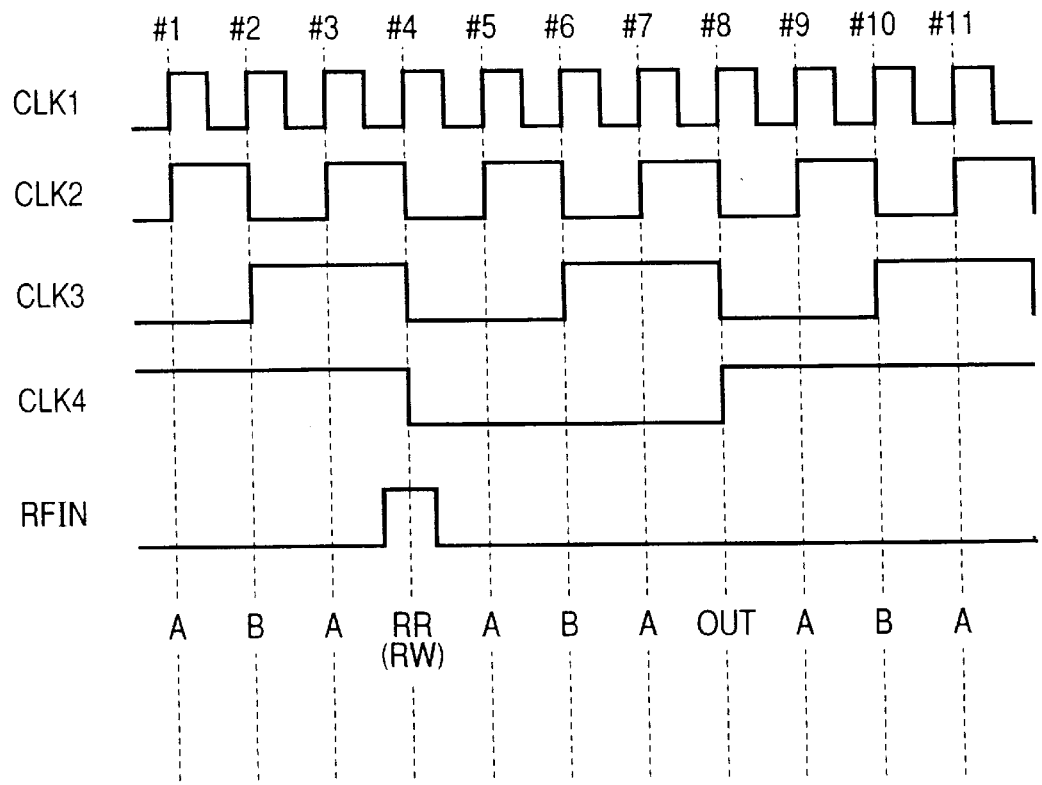

FIGS. 5A and 5B are diagram for explaining an embodiment of a semiconductor chip including a refresh-free pipelined dynamic memory RFPDRAM which hides the refresh operation. In FIG. 5A, CLKG indicates a clock generator to generate, in response to an external clock signal CLK, clock signals CLK1 to CLK3 used in the chip. The signals CLK1 to CLK3 may be inputted from an external device. However, when one of the signals CLK1 to CLK3 or a signal CLK4, which will be described later, is received from an external device and the remaining clock signals are generated in the chip, the number of chips can be minimized and this operation is suitable for the usability. As shown in FIG. 5B, the ratio between the frequencies respectively of CLK1, CLK2, and CLK is 4:2:1 and a rising edge of CLK3 matches a falling edge of CLK2. Logic circuits A and B access the refresh-free pipelined dynamic memory RFPDRAM using, as reference points of operation, the rising edges of CLK2 and CLK3, respectively. The RFPDRAM receives three accesses from the logic circuits A and B and an external circuit. BUSCTL indicates a bus controller which controls communication of signals via the bus, communication of data via the bus with an external device, and an access from an external device to the RFPDRAM. In the operation examples of the embodiments above, the RFPDRAM receives two clocks. In this embodiment, it is assumed that the RFPDRAM receives only the signal CLK1 having a highest speed and generates clock signals and other signals necessary in the chip according to the CLK1. Also, it is assumed that the bus controller BUSCTL receives only the signal CLK1 having a highest speed and generates clock signals and other signals necessary in the chip according to the CLK1. FIG. 5B shows timing of primary clock signals in the embodiment and types of accesses synchronized with the timing in the embodiment. A, B, and Out respectively indicate accesses from the circuit A, circuit B, and an external circuit. For the refresh operation, there are shown RR (a read operation associated with a refresh operation) and RW (a write operation associated with a refresh operation). The access from an external device is executed at timing synchronized with a rising edge of the clock signal CLK4. It is assumed in this case that the signal CLK4 is generated in the bus controller using the signal CLK1 and is used in the input/output circuit. Therefore, the signal is not shows in the output signals from the clock generator. However, naturally, it is also possible that the signal CLK4 is generated by the clock generator and is delivered in the chip. Depending on cases, when it is difficult for the external circuit to generate input/output timing, the signal CLK4 may be outputted to the external device so that the external device uses the signal CLK4. RFIN indicates the refresh input described in the embodiments above. The operation RR or RW is executed at timing synchronized with the signal RFIN. The signal RFIN is generated at timing corresponding to a falling edge of the signal CLK4.

As can be seen from FIG. 5B, when compared with the frequency of the signal CLK1 as the operating frequency of the RFPDRAM, the operating frequencies of the logical circuits are ½ and ¼ of the frequency of the signal CLK1 and the operating frequency for an external access and a refresh operation is ⅛ of the frequency of the signal CLK1. There does not occur any conflict therebetween. According to the embodiment described above, it is possible to design a semiconductor chip which hides the refresh operation from the accesses from many circuits and the external circuit. A specific application example of such a semiconductor chip can be a graphics chip. In this case, the RFPDRAM can be used as a unit which serves as a frame memory to keep pixel data of a screen and which also serves as a memory to keep a texture mapping pattern. Assume that the logic circuit A is a drawing circuit to draw graphic data and the logic circuit is a circuit to draw a texture mapping pattern. The logic circuits A and B execute drawing operations by repeatedly executing operation in which data is read to be moved to the RFPDRAM, operations are executed for the data, and writes resultant data therein. In concurrence with the drawing, the frame data must be read out to an external device at a frequency of about 30 to about 60 times per second to display a screen image. In general, when compared with the display data, the drawing data requires a higher memory data transfer speed. It is therefore convenient that accesses of different frequencies can be distributed as in the embodiment. According to the embodiment, since the refresh operation is hidden from the respective circuits, it is not necessary to add a refresh controller to the logic circuits. Therefore, the chip can be more easily configured. In the embodiment in which it is assumed that the frequencies of CLK1, CLK2, CLK3, CLK4 are respectively f1, f2, f3, and f4, there exists relationships of $f2=f1/2$, $f3=f1/4$, and $f4=f1/8$ for simplicity. However, in general, it is only necessary to satisfy a relationship that f1 is equal to or more than the sum of f2, f3, and f4, namely, $f1 \geq f2+f3+f4$.

Figure 6:
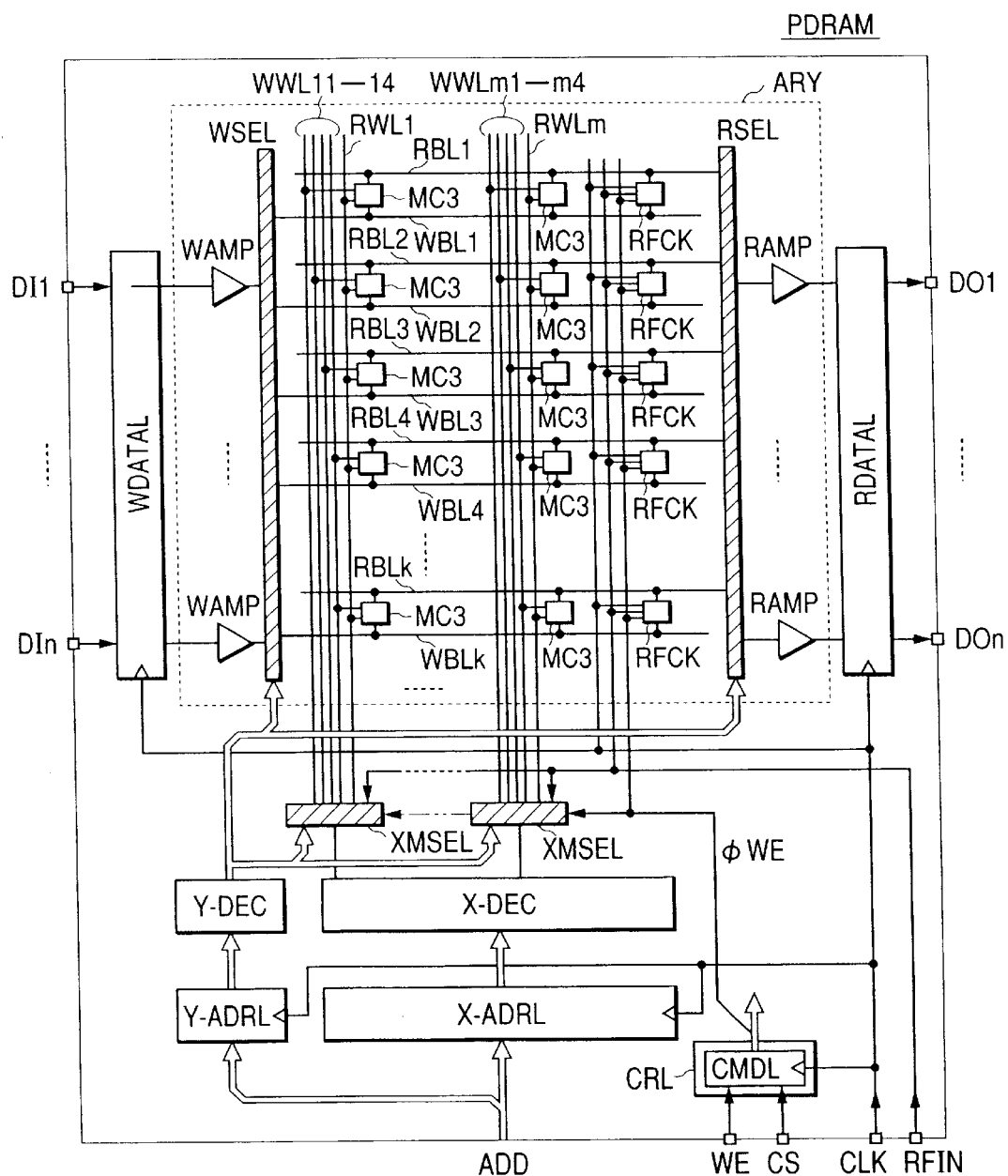
FIG. 6 is a diagram showing constitution of a second embodiment of the PDRAM achieving the refresh operation in the PDRAM.

FIG. 6 shows a second embodiment of a pipelined dynamic memory including 3T-DRAM cells. The embodiment is configured such that by increasing the number of memory cells selected in a refresh operation, the refresh cycle (the number of accesses necessary to refresh all memory cells of the entire PDRAM) is minimized. The 3T-DRAM cell is advantageous, when compared with the 1T-DRAM cell, in that a sufficient read or readout signal can be obtained even when a capacitor of a small capacity is used. In the 1T-DRAM cell, the readout signal quantity is determined only according to distribution of charges between the memory capacity and the bit line capacity. In contrast therewith, in the 3T-DRAM cell, the bit line is driven by a transistor, there exists an advantage of the gain of the transistor. However, for example, (1) the gate capacity is relatively small, (2) various leakage currents flow via the memory cell transistors, and the like, it is difficult to improve the retention characteristic of the memory cell depending on cases. Naturally, the accumulation charge can be increased by disposing another capacitor other than that of the transistor and by increasing the size of the transistor. However, this increases the process steps and the memory cell area, which leads to a fear of increase in the production cost. When the retention characteristic is not satisfactory, the minimum operating frequency of the PDRAM may be limited in an extreme case. In such a case, it is favorable to use the configuration of FIG. 6 because the refresh cycle can be minimized.

In the first embodiment, to execute a refresh operation, data is once read and is moved to an area outside the PDRAM and the data is then re-written therein. When the data is read to be moved to the outside of the PDRAM, the number of memory cells which can be refreshed in one refresh operation is limited by the number of amplifiers and the numbers of input and output terminals. To overcome this difficulty, in the configuration of FIG. 6, the read and write operations associated with the refresh operation are executed in the memory array. As a result, k memory cells activated in the read operation can be simultaneously refreshed, and hence the refresh cycle advantageously becomes ¼ of (n=k/4 in FIG. 1) that of the configuration of FIG. 1. The configuration of FIG. 6 primarily differs from that of FIG. 1 in that a refresh circuit is arranged for each bit line, an x multiselector circuit XMSEL is disposed in place of the x selector circuit XSEL, and the PDRAM itself includes a refresh input signal terminal to control the x multiselector circuit XMSEL using a refresh input signal. The refresh operation will now be described (the ordinary read and write operations (non-destructive operations) are the same as those of the embodiment of FIG. 1, and hence description thereof will be avoided). First, in the readout operation for the refresh operation, one read word line is selected. Assume that RWL1 is selected in this case. As a result, data read from each of k memory cells connected to the selected RWL1 is fed via the associated read bit line to be stored in the refresh circuit RFCK disposed for each bit line. Thereafter, in the write operation for the refresh operation, four word lines (WWL11 to WWL14 in this case) of one group are simultaneously selected, and the data is simultaneously written directly from each refresh circuit RFCK via the write bit line to the pertinent memory cell. In this embodiment as above, in the write operation for the refresh operation, four word lines of one group are simultaneously selected. Naturally, in an ordinary write operation, only one write word line is activated like in the operation shown in FIG. 1. In the embodiment described above, when compared with the ordinary write operation, the number of memory cells selected in the refresh operation can be increased and hence the refresh cycle can be minimized.

Figure 7:
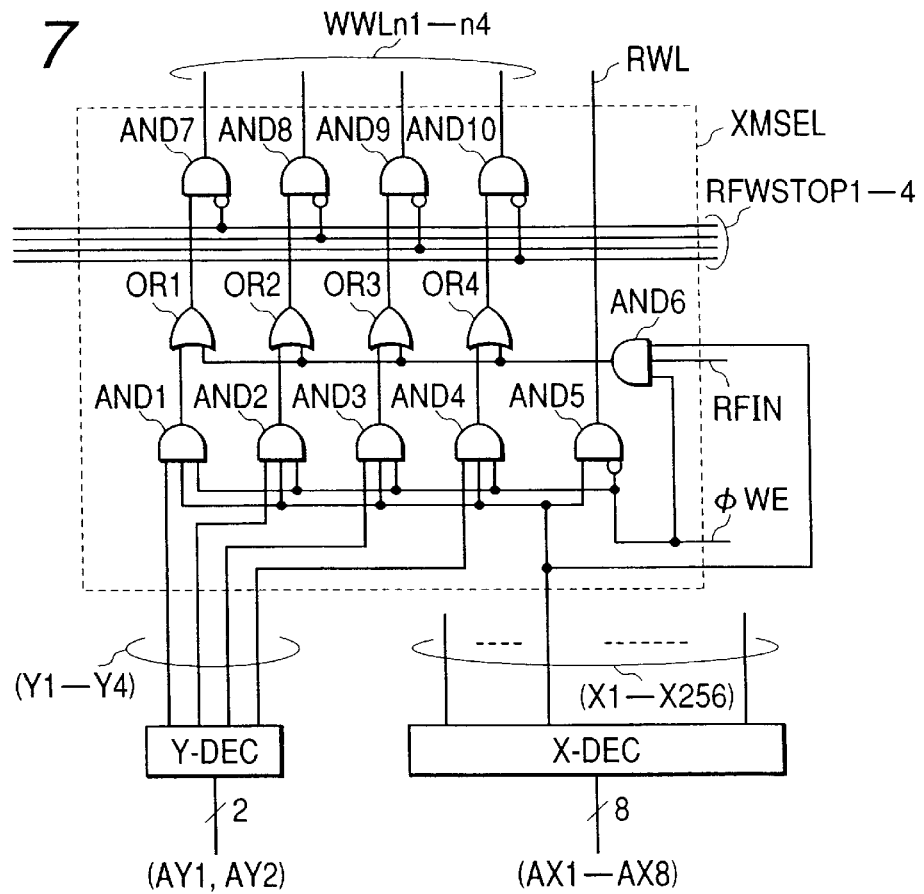
FIG. 7 is a diagram showing constitution of an embodiment of a circuit to select a word line in the embodiment of FIG. 6.

FIG. 7 shows an embodiment of a circuit to implement the word selection as above. It is assumed in FIG. 7 that the number of read word lines of the PDRAM of FIG. 6 is 256 and the number of 4-word-line groups is 256. In FIG. 7, 3-input AND circuits and 3-input OR circuits are employed for easy understanding of the logical relationship between the circuits. However, it is to be understood that the circuit configuration can be implemented using combinations of logic circuits having a smaller number of inputs, ordinary NOR circuits, NAND circuits, and inverter circuits. In FIG. 7, a signal φWE is a signal generated from a write enable signal and is set to high potential in the write operation. A refresh input signal RFIN is set to high potential in the read or write operation associated with a refresh operation or in a refresh mode. In an ordinary read operation and in a read operation in the refresh mode, the x decoder sets one of the lines X1 to X256 to high potential and the signal φWE to low potential. Therefore, only one read word line is selected by an AND gate 5 in the x multiselector XMSEL. On the other hand, in the write operation in the refresh mode, φWE is set to high potential and one of the output lines from the y decoder is set to high potential. Therefore, only one of the output signals from AND1 to AND4 is set to high potential. However, since the RFIN signal and φWE inputted to the AND6 are at high potential, the output from the AND6 is set to high potential, and the outputs from OR1 to OR4, namely, four word lines of the groups are set to high potential. In an ordinary write operation, the signal RFIN is at low potential, and hence only one of four word lines of the group is set to high potential.

Figure 8:
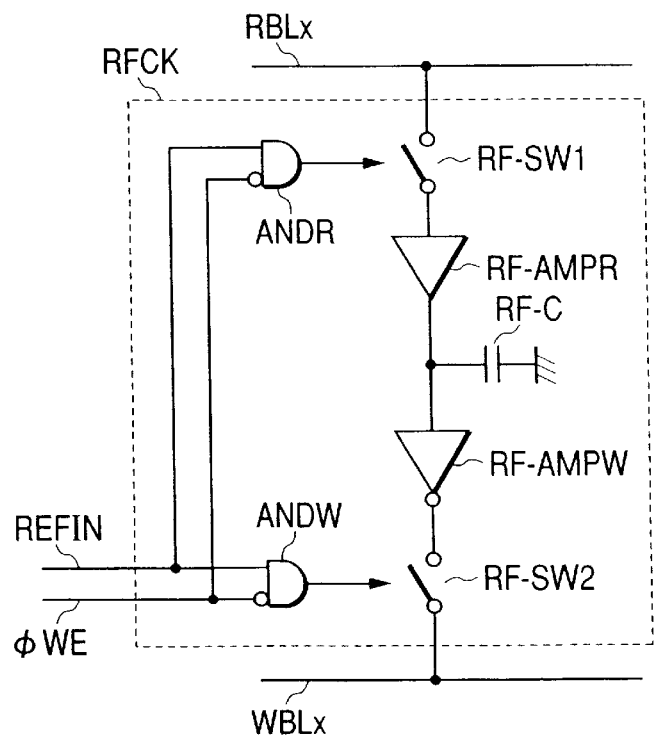
FIG. 8 is a diagram showing constitution of an embodiment of a refresh circuit in the embodiment of FIG. 6.

FIG. 8 shows a configuration of the refresh circuit RFCK disposed for each bit line in the embodiment of FIG. 6. Also in FIG. 8, simple logic symbols and switches are used for easy understanding of the logical relationship between the circuits. However, the actual circuit system can be naturally configured using combinations of ordinary basic gate circuits. Operation of the embodiment of FIG. 8 will be next described. First, in the read operation in the refresh mode, the signal RFIN is at high potential and φWE is at low potential, and hence the output from the gate ANDR is set to high potential. Therefore, a read signal is sent from the read bit line RBLx via a switch RF-SW1 to a refresh read data amplifier RF-AMPR and is held in a capacitor RF-C. The capacitor may be replaced with an input capacity of an amplifier in the subsequent stage. However, if this causes a problem of leakage, another capacity element may be disposed. In this section, an inherent latch circuit may be used. However, to arrange an RFCK circuit between the respective bit lines, the simple configuration of the embodiment is advantageous because of a small area occupied by the circuit. In the write operation in the refresh mode, the signal RFIN is also at high potential, but the signal φWE is set to high potential. Therefore, the output from the gate ANDW is set to high potential, and the output from the refresh write amplifier RF-AMPW is written via a switch RF-SW2 and the write bit line WBLx in the memory cell. In the 3T-DRAM cells, according to the ordinary design, the signal is read from therefrom in a reverse state. In such a case, it is necessary to add a signal inverting function to either one of the amplifiers RF-AMPR and RF-AMPW to invert the information. In the example of FIG. 6, the amplifier RF-AMPW includes an inverter having a signal inverting function. When the information is not reversed in the read operation depending on the memory cell design, it is natural that the information need not be inverted in the refresh circuit RFCK as above. According to the refresh circuit of FIG. 7 described above, the information is held without using an inherent latch circuit, the occupied area can be reduced. Therefore, the increase in the occupied area when the circuit is disposed for each bit line can be considerably minimized.

Figure 9:
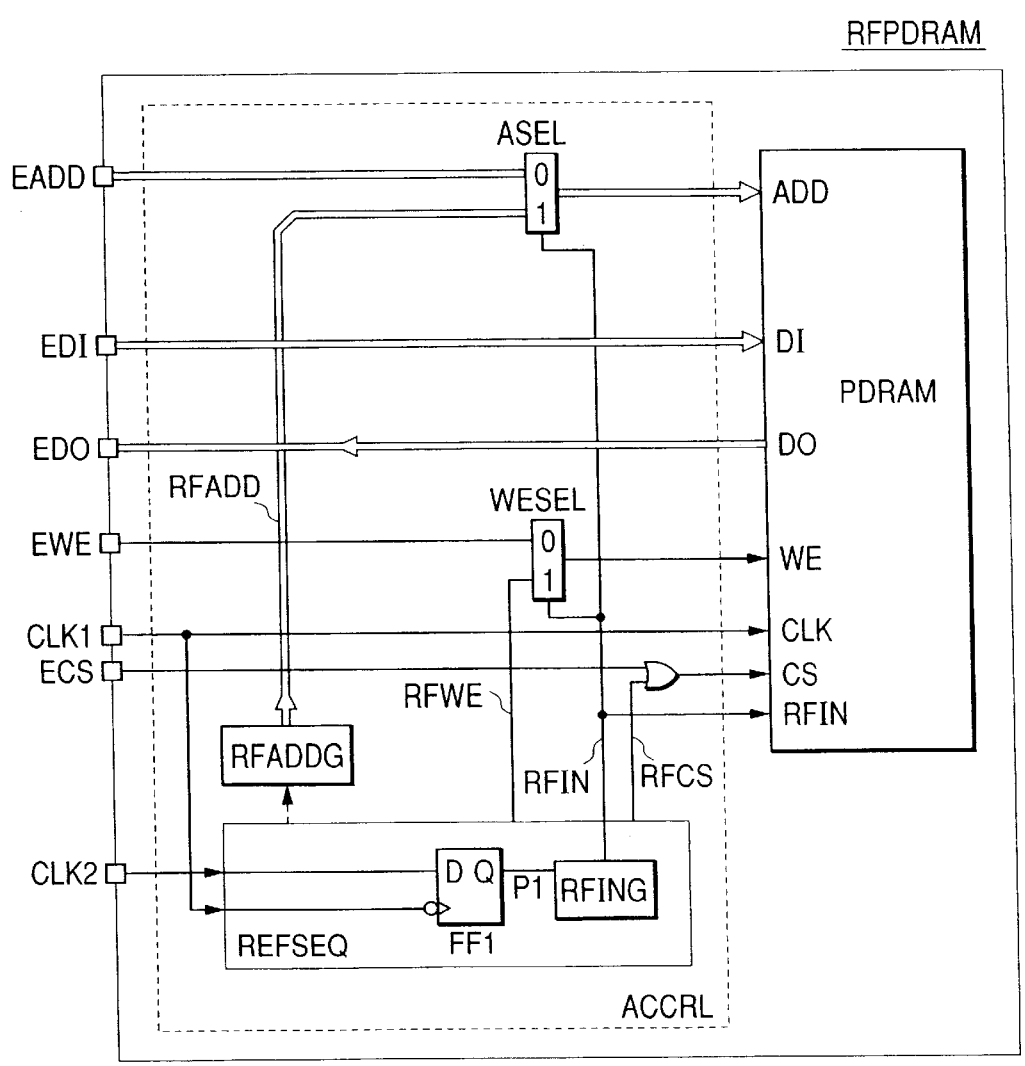
FIG. 9 is a diagram showing constitution of an embodiment of a refresh-free pipelined dynamic memory (RFPDRAM) including a control circuit to externally hide the refresh operation from the PDRAM of FIG. 6.

FIG. 9 shows a configuration of a control circuit to hide the refresh operation in the memory PDRAM of FIG. 6. The configuration of FIG. 6 primarily differs from that of FIG. 3 in that the data latching or storing operation in the refresh mode is executed by the refresh circuit RFCK in the memory PDRAM, and hence the data latching function disposed outside the memory PDRAM is removed. Additionally, since a refresh input signal RFIN is used in the memory PDRAM, the signal RFIN is inputted thereto. The other basic operations are the similar to those described in conjunction with FIGS. 3 and 4, and description thereof will be avoided. Also in this embodiment, an operation similar to that of FIG. 5 can be executed.

According to the embodiments shown in FIGS. 6 to 9 above, in a memory including 3T-DRAM cells, the pipeline operation in which the refresh operation is hidden from the accesses from external circuits can be carried out. Moreover, the refresh operation can be efficiently executed in a shorter period of time. Therefore, the memory can execute a stable operation even if the accumulation capacity is small and the leakage is relatively large.

Description has been given of embodiments of the present invention. However, the present invention is not restricted by the embodiments, and various modifications of the embodiments are naturally possible within the spirit and scope of the present invention. For example, although the circuits WAMP and RAMP are disposed on both sides of a bit line in FIGS. 1 and 6, the actual circuit layout is not restricted by this arrangement. The circuits WAMP and RAMP may be disposed to be connected to one end of the bit line. It is also possible to use a so-called shared sense amplifier layout in which the circuits WAMP and RAMP are connected respectively to both ends of the bit line an memory cells are connected to the respective bit lines.

Furthermore, a precharge circuit of the bit line is not shown in FIGS. 1 and 6 also for simplicity of the drawings. It is natural that circuits necessary for the memory circuit operation such as a precharge circuit are additionally disposed at appropriate positions. Although not particularly described, it is necessary in some cases to apply higher potential to the transistor connected, for example, to the word line of a memory cell than to the transistor used in other peripheral circuits. In such a case, it is naturally necessary to use a transistor sufficiently resistive against the voltage limit for the gate of the transistor. For example, the transistors may be selectively used according to the condition of use thereof, that is, as a transistor to which high potential is applied, a transistor having a thick gate oxide film is employed. In the peripheral circuit, a transistor having a thin gate oxide film is employed.

In the embodiments above, there are assumed 3T-DRAM cells in each of which the read word line is separated from the write as shown in FIG. 2. However, 3T-DRAM cells of another types may be used. For example, 3T-DRAM cells used in a semiconductor device described in pages 42 and 43 of the proceedings of the 1970 IEEE International Solid State Circuit Conference may be employed in the present invention. In the 3T-DRAM cell, a read word line and a write word line are commonly used. However, also in this case, to implement the non-destructive operation, it is necessary to employ word lines grouped as in FIG. 1 or FIG. 6 to prevent destruction of information in the write operation. In this case, it is required to change the configuration and control of the word line and selector circuits as well as the control operation of potential on word lines in the read and write operations. However, such changes are in a range which can be executed by ordinary circuit techniques, and hence description thereof will be avoided.

Some of advantages of the embodiments are as follows.

(1) The write and read operations are executed as non-destructive operations, and the read and write operations are pipelined. When the write and read operations are executed as non-destructive operations as in the prior art example, a memory having a cycle time reduced to some extent can be implemented. In addition, when the read and write operations are pipelined, accesses from external circuits can be received in a cycle time shorter than the inherent cycle time.

(2) By using memory cells each including only transistors such as 3T-DRAM cells, a memory can be implemented at a low process cost.

(3) By operating the memory with a frequency higher than the frequency of the clock signal as a reference of an external access, a refresh operation is executed when access is not received from an external circuit. Therefore, the refresh operation can be hidden from the external circuit.

(4) By using 3t-DRAM or 1T-DRAM cells each including a small number of elements, there can be implemented a memory having an area smaller than that of the memory including 6T-SRAM cells.

(5) By setting the operating frequency of the memory to a value larger than a value obtained by adding the total value of frequencies of clock signals as references of accesses from external circuits to a value of the frequency of the clock signal as a reference of the internal refresh operation, the accesses from the external circuits and the access necessary for the refresh operation can be accomplished without conflict therebetween. That is, the refresh operation can be hidden from all circuits to access the memory, and hence there can be implemented a memory having suitable usability.

According to the above-mentioned advantages of the present invention, it is possible to implement a highly integrated, high-speed memory at a low production cost in which the refresh operation is hidden and accesses from many circuits can be received without conflict therebetween. When necessary, it is possible to implement a memory having part of the advantages. Therefore, it is possible to implement a semiconductor device having characteristics which are absent in the memories of the prior art or it is possible to implement a semiconductor device including a logic circuit and a memory.

The specification and drawings are, accordingly, to be regarded in an illustrative rather than a restrictive sense, it will, however, be evident that various modifications and changes may be made thereto without departing from the broader spirit and scope of the invention as set forth in the claims.

What is claimed is:

1. A semiconductor device comprising:
   a plurality of DRAM memory cells each having first, second, and third MOS transistors;
   a plurality of first word lines coupled to gates of said first MOS transistors;
   a plurality of second word lines coupled to gates of said second MOS transistors;
   a plurality of first bit lines coupled to source/drain paths of said first MOS transistors;
   a plurality of second bit lines coupled to source/drain paths of said second MOS transistors,
   wherein the plurality of DRAM memory cells includes a series of such memory cells defining a plurality of groups of k memory cells in sequence, and the plurality of first word lines includes a group of k first word lines, each of which is coupled to a gate of only one first MOS transistor in each group of k memory cells, wherein k is greater than one, and wherein the number of data inputted for writing data when one of said plurality of first word lines is selected is the number of said DRAM memory cells provided to said one of said plurality of first word lines.

2. The semiconductor device according to claim 1;

wherein each gate of said third MOS transistor is coupled to the source/drain path of said first MOS transistor, and each source/drain path of said third MOS transistor is coupled to the source/drain path of said second MOS transistor.

3. The semiconductor device according to claim 1, wherein the number of said plurality of first word lines is larger than the number of said plurality of second word lines.

4. The semiconductor device according to claim 1, wherein one of said plurality of first word lines is selected for write operation and one of said plurality of second word lines is selected for read operation, and wherein read operation and write operation are pipelined.

5. The semiconductor device according to claim 1, wherein said plurality of DRAM memory cells are not destructed during read operation and write operation.

6. A semiconductor device comprising:

a plurality of DRAM memory cells each having first, second, and third MOS transistors;

a plurality of first word lines coupled to gates of said first MOS transistors;

a plurality of second word lines coupled to gates of said second MOS transistors;

a plurality of first bit lines coupled to source/drain paths of said first MOS transistors;

a plurality of second bit lines coupled to source/drain paths of said second MOS transistors, wherein the number of said plurality of first word lines is larger than the number of said plurality of second word lines, and wherein the plurality of DRAM memory cells includes a series of such memory cells defining a plurality of groups of memory cells in sequence, and the plurality of first word lines includes a group of k first word lines, each of which is coupled to a gate of a first MOS transistor only in every $k^{th}$ DRAM memory cell of the series, wherein k is greater than one.

7. The semiconductor device according to claim 6, wherein each gate of said third MOS transistor is coupled to the source/drain path of said first MOS transistor, and each source/drain path of said third MOS transistor is coupled to the source/drain path of said second MOS transistor.

8. The semiconductor device according to claim 6, further comprising:

an X address latch and a Y address latch, and wherein one of said plurality of first word lines is selected for write operation and one of said plurality of second word lines is selected for read operation, and wherein read operation and write operation are pipelined.

9. The semiconductor device according to claim 6, wherein said plurality of DRAM memory cells are not destructed during read operation and write operation.

10. The semiconductor device according to claim 6, wherein the number of data inputted for writing data into one of said plurality of first word lines is the number of said DRAM memory cells provided to said one of said plurality of first word lines.

* * * * *